United States Patent
Coffy et al.

(10) Patent No.: US 11,502,227 B2
(45) Date of Patent: Nov. 15, 2022

(54) ELECTRONIC DEVICE COMPRISING OPTICAL ELECTRONIC COMPONENTS AND FABRICATING PROCESS

(71) Applicant: STMicroelectronics (Grenoble 2) SAS, Grenoble (FR)

(72) Inventors: Romain Coffy, Voiron (FR); Remi Brechignac, Grenoble (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 120 days.

(21) Appl. No.: 17/006,128

(22) Filed: Aug. 28, 2020

(65) Prior Publication Data
US 2021/0066554 A1    Mar. 4, 2021

(30) Foreign Application Priority Data
Sep. 3, 2019 (FR) ...................................... 1909670

(51) Int. Cl.
*H01L 33/52* (2010.01)
*H01L 31/0203* (2014.01)
(Continued)

(52) U.S. Cl.
CPC .......... *H01L 33/52* (2013.01); *H01L 31/0203* (2013.01); *H01L 31/02164* (2013.01); *H01L 33/44* (2013.01); *H01L 33/62* (2013.01)

(58) Field of Classification Search
CPC ................. H01L 33/52; H01L 31/0203; H01L 31/02164; H01L 33/44; H01L 33/62; H01L 2224/48091; H01L 2224/73265; H01L 2224/97; H01L 2924/181; H01L 2933/005; H01L 25/167; H01L 25/165; H01L 21/56; H01L 23/3114; H01L 23/3121
See application file for complete search history.

(56) References Cited

U.S. PATENT DOCUMENTS

| 8,362,496 | B1 * | 1/2013 | Tu ........................ H01L 23/3107 257/82 |
| 10,734,540 | B1 * | 8/2020 | Chen ........................ H01L 33/44 |

(Continued)

FOREIGN PATENT DOCUMENTS

| CN | 105206627 A | 12/2015 |
| EP | 3067927 A1 | 9/2016 |
| FR | 2977715 A1 | 1/2013 |

OTHER PUBLICATIONS

INPI Search Report and Written Opinion for FR 1909670 dated Mar. 11, 2020 (10 pages).

*Primary Examiner* — Victor A Mandala
(74) *Attorney, Agent, or Firm* — Crowe & Dunlevy

(57) ABSTRACT

An electronic device includes a first electronic component and a second electronic. Each electronic component includes a carrier substrate having a back side and a front side, an electronic chip including an integrated optical element, an overmolded transparent block encapsulating the electronic chip above the carrier substrate, and electrical connections between the electronic chip and electrical contacts of the carrier substrate. An overmolded grid encapsulates and holds the first and second electronic components. The grid is configured so that sides of the first and second electronic components are at least partially exposed.

18 Claims, 6 Drawing Sheets

(51) Int. Cl.
*H01L 31/0216* (2014.01)
*H01L 33/44* (2010.01)
*H01L 33/62* (2010.01)

(56) References Cited

U.S. PATENT DOCUMENTS

| | | |
|---|---|---|
| 2004/0208210 A1 | 10/2004 | Inoguchi |
| 2010/0259920 A1* | 10/2010 | Lin .......................... F21S 4/28 |
| | | 362/249.02 |
| 2013/0075764 A1* | 3/2013 | Yu ....................... H01L 31/0203 |
| | | 257/82 |
| 2014/0021491 A1* | 1/2014 | Meng ...................... H01L 33/54 |
| | | 257/82 |
| 2014/0175462 A1* | 6/2014 | Lermer ............... H01L 31/0203 |
| | | 257/82 |
| 2015/0060905 A1* | 3/2015 | Nam ....................... H01L 33/60 |
| | | 257/89 |
| 2015/0279826 A1* | 10/2015 | Tu ....................... H01L 31/0203 |
| | | 438/25 |
| 2015/0279827 A1* | 10/2015 | Tu ..................... H01L 31/02325 |
| | | 257/432 |
| 2015/0340346 A1* | 11/2015 | Chu ........................ H01L 33/50 |
| | | 257/89 |
| 2016/0041029 A1* | 2/2016 | T'Ng ..................... G01J 3/0227 |
| | | 250/239 |
| 2017/0052277 A1 | 2/2017 | Wong et al. |
| 2018/0190629 A1* | 7/2018 | Hsu ..................... H01L 31/0203 |
| 2019/0096864 A1* | 3/2019 | Huitema ................. H01L 33/62 |
| 2019/0195685 A1 | 6/2019 | Herard et al. |
| 2019/0207051 A1* | 7/2019 | Utsumi ............. H01L 31/02005 |
| 2019/0214376 A1* | 7/2019 | Kim ..................... H01L 27/1259 |
| 2019/0325803 A1* | 10/2019 | Chen ........................ G09G 3/32 |
| 2020/0035748 A1* | 1/2020 | Xia ....................... H01L 27/156 |
| 2020/0083281 A1* | 3/2020 | Wu ........................ G03F 7/0007 |
| 2020/0235084 A1* | 7/2020 | Wu .......................... H01L 24/32 |
| 2020/0373469 A1* | 11/2020 | Chen ....................... H01L 33/52 |
| 2021/0066554 A1 | 3/2021 | Coffy et al. |

* cited by examiner

1

ELECTRONIC DEVICE COMPRISING OPTICAL ELECTRONIC COMPONENTS AND FABRICATING PROCESS

PRIORITY CLAIM

This application claims the priority benefit of French Application for Patent No. 1909670, filed on Sep. 3, 2019, the content of which is hereby incorporated by reference in its entirety to the maximum extent allowable by law.

TECHNICAL FIELD

The present invention relates to the field of microelectronics and, more particularly, to the field of electronic devices comprising electronic chips including integrated optical elements for emitting and/or receiving light.

BACKGROUND

Known electronic devices comprise a carrier substrate including a network of electrical connections, an electronic chip for emitting light and an electronic chip for receiving light, said chips being mounted, a distance apart, above one side of the carrier substrate, and an encapsulating cover mounted on said side of the carrier substrate and delineating chambers in which the electronic chips are respectively located, this encapsulating cover containing apertures facing the optical elements of the electronic chips, in which filters of the light are generally provided.

Such electronic devices require a high number of fabricating and mounting operations.

SUMMARY

According to one embodiment, an electronic device is proposed, said electronic device comprising: at least one first and one second electronic component respectively comprising an opaque carrier substrate having a back side and a front side, an electronic chip a back side of which is mounted on the front side of the carrier substrate and including an integrated optical element facing a front side of this chip, an overmolded transparent block encapsulating the chip above the front side of the carrier substrate, and electrical connections between the chip and the back electrical contacts of the back side of the carrier substrate, and an opaque overmolded grid for encapsulating and holding the electronic components, the encapsulating and holding grid being configured so that the back sides of the electronic components are exposed and so that at least those zones of the front sides of the electronic components that are in front of the optical elements are exposed.

Thus, the electronic device forms an independent unit in which the grid itself holds and encapsulates the electronic components, and the electrical contacts of the carrier substrates of the electronic components, which are distant from each other, are available for outside connections.

The encapsulating and holding grid may have a back side that is located in the same plane as the back sides of the electronic components.

The encapsulating and holding grid may have a front side located in the same plane as a front side of at least one of the electronic components.

The encapsulating and holding grid may have at least one rim above the front side of at least one of the electronic components, this rim delineating an aperture.

The encapsulating and holding grid may comprise a peripheral wall and an intermediate partition extending between the electronic components.

The encapsulating blocks may be provided with a filtering material that filters light.

The filtering material may comprise layers above the encapsulating blocks.

The filtering material may comprise particles included in the material of the encapsulating blocks.

The optical element of one of the electronic components may be a light emitter and the optical element of the other of the electronic components may be a light receiver.

An electronic assembly is also provided, said assembly comprising a receiving substrate that includes a network of electrical connections and an electronic device mounted above the receiving substrate.

The electronic device is in a position such that the back sides of the electronic components are adjacent to the receiving substrate and such that the back electrical contacts are connected to the electrical contacts of the network of electrical connections of the receiving substrate.

A process for fabricating an electronic device is also provided, said process comprising the following steps: providing at least one first and one second electronic component respectively comprising a carrier substrate having a back side and a front side, an electronic chip a back side of which is mounted on the front side of the carrier substrate and including an integrated optical element facing a front side, an overmolded transparent block encapsulating the chip above the front side of the carrier substrate, and electrical connections between the chip and the back electrical contacts of the back side of the carrier substrate; mounting, at distance from each other, the electronic components above a side of a provisional carrier substrate, in positions such that the back sides, or conversely the front sides, of the electronic components are adjacent to the provisional carrier substrate; placing the electronic components in a cavity of a mold, in positions such that the provisional carrier substrate is adjacent to one face of the cavity and such that the front sides of the electronic components are at least partially adjacent to another face of the cavity, at least in the zones of the optical elements, or conversely such that the back sides of the electronic components are adjacent to another face of the cavity; injecting an opaque encapsulating material into the cavity so as to obtain an encapsulating and holding grid containing spaces in which the electronic components are located; and demolding the obtained electronic device.

The process may comprise the following step: singulating the obtained electronic device so that the encapsulating and holding grid has a peripheral wall and an intermediate wall extending between the electronic components.

The singulation may be obtained by sawing.

BRIEF DESCRIPTION OF THE DRAWINGS

Electronic devices will now be described by way of nonlimiting examples of embodiments, which examples are illustrated by the appended drawings, in which.

DETAILED DESCRIPTION

With reference to FIGS. 1-4, individual electronic components 1 and 2 and batch processes for manufacturing these electronic components will firstly be described.

Figure 1:
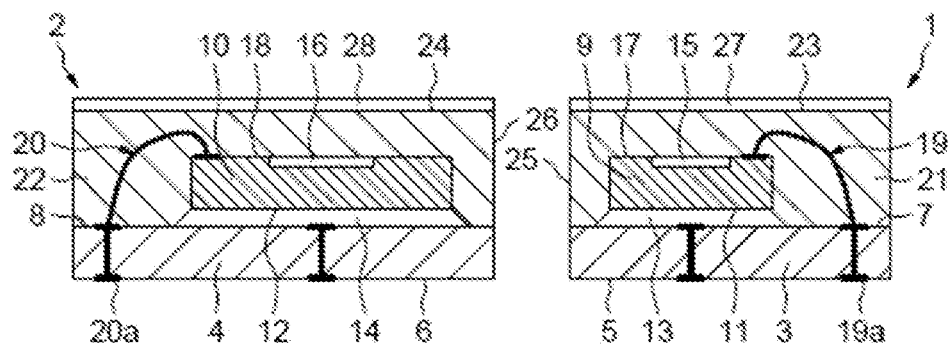
FIG. 1 shows in cross section two separate electronic components.

As illustrated in FIG. 1, the individual electronic components 1 and 2 comprise carrier substrates 3 and 4, made of an opaque material, which have back sides 5 and 6 and front sides 7 and 8 and comprise optical electronic integrated circuit (IC) chips 9 and 10 that are mounted above the front sides 7 and 8 of the carrier substrates 3 and 4. The carrier substrates are made of a dielectric material.

To achieve this, the back sides 11 and 12 of the chips 9 and 10 are fastened above the front sides 7 and 8 of the carrier substrate 3 and 4 by way of adhesive layers 13 and 14. The carrier substrates 3 and 4 are made of an opaque material such as, for example, an opaque resin.

The chips 9 and 10 include integrated optical elements 15 and 16 that are oriented on the side of their front sides 17 and 18.

The optical element 15 of the chip 9 is a light emitter and the optical element 16 of the chip 10 is a light receiver.

The individual electronic components 1 and 2 comprise electrical connections 19 and 20 that connect the chips 9 and 10 to back electrical contacts 19a and 20a of the back sides 5 and 6 of the carrier substrates 3 and 4.

For example, the electrical connections 19 and 20 comprise electrical connection vias that pass through the carrier substrates 3 and 4 and that are connected to back electrical contacts of the chips 9 and 10 by way of electrically conductive adhesive layers 13 and 14, and by way of electrical wires that are connected to front bumps of the chips 9 and 10.

The electronic components 1 and 2 comprise overmolded encapsulating blocks 21 and 22, made of a material that is transparent such as, for example, an epoxy, so as to let light pass, above the front sides 7 and 8 of the carrier substrates 3 and 4, in which blocks the chips 9 and 10 and the electrical connections 19 and 20 are embedded.

The encapsulating blocks 21 and 22 have front faces 23 and 24 that are parallel to the carrier substrates 3 and 4 and lateral faces 25 and 26 that follow the perimeter of the carrier substrates 4. Thus, the electronic components 1 and 2 are parallelepipedal in shape.

Optionally, the front faces 23 and 24 of the encapsulating blocks 21 and 22 are covered with layers 27 and 28 made of a material that filters light, infrared rays for example.

According to one variant embodiment, the material from which the encapsulating blocks 21 and 22 is made could include specific particles playing the role of a filter of light.

The back sides 5 and 6 of the carrier substrates 3 and 4 form the back sides of the electronic components 1 and 2. The front faces 23 and 24 of the encapsulations 21 and 22, which optionally include the filtering layers 27 and 28, form the front sides of the electronic components 1 and 2.

The electronic components 1 and 2 may be fabricated in the following way.

Figure 2:
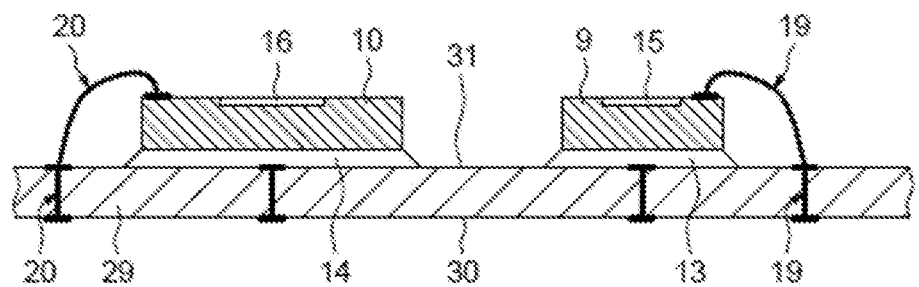
FIGS. 2-5 show steps of fabrication of the electronic components of FIG. 1.

As illustrated in FIG. 2, a batch carrier substrate 29 is provided, said substrate having a back side 30 and a front side 31 and including, in a number of sites, through vias or networks of electrical connections for the aforementioned electrical connections 19 and 20. These sites are advantageously adjacent and rectangular or square, and are arranged in rows and columns.

In these separate sites and at distance, chips 9 and 10 are mounted above the front side 31 of the batch carrier substrate 29 by way of electrically conductive adhesive layers 13 and 14, and the electrical connections 19 and 20 are made such as described above.

Figure 3:
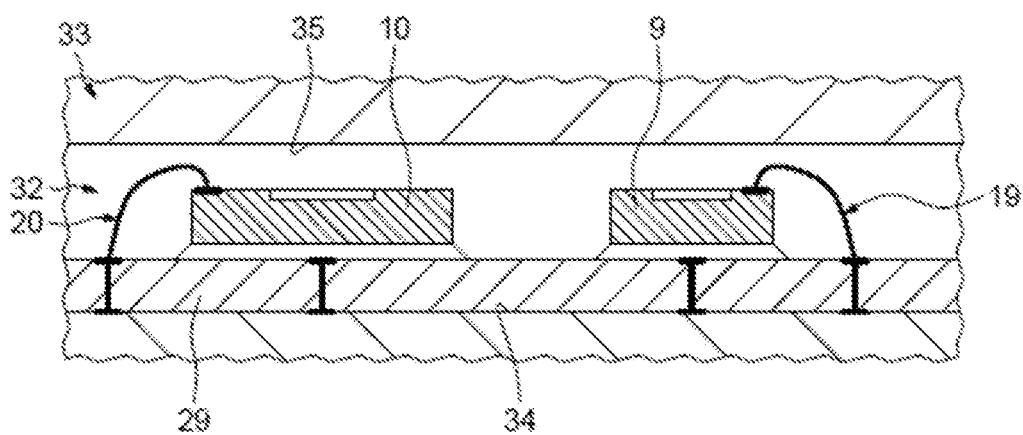

Next, as illustrated in FIG. 3, the batch carrier substrate 29, equipped with the chips 9 and 10, is placed in a cavity 32 of a mold 33, in a position such that the batch carrier substrate 29 is adjacent to a face 34 of the cavity 32 and such that a face 35, opposite and parallel to the face 34, is located at distance above the chips 9 and 10.

Figure 4:
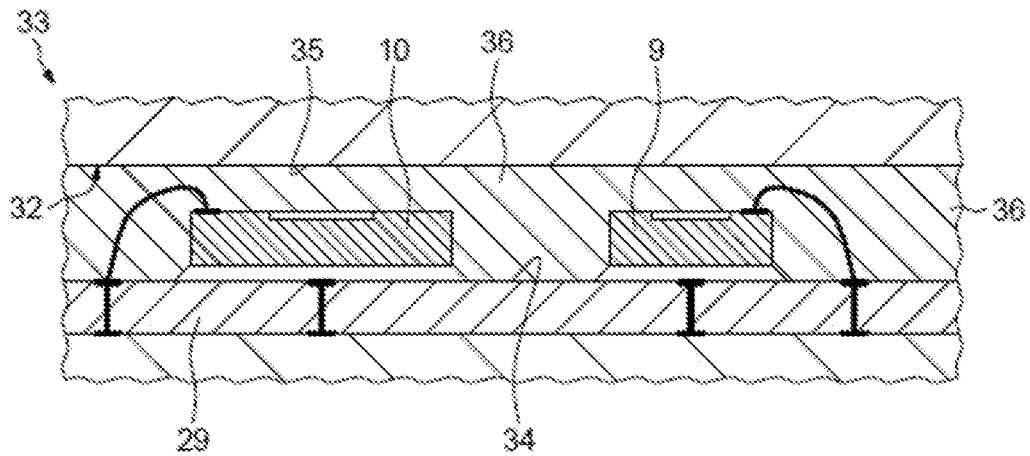

Next, as illustrated in FIG. 4, an encapsulating material is injected into the cavity 32 of the mold 33 so as to form, by overmolding, a batch encapsulating block 36.

Figure 5:
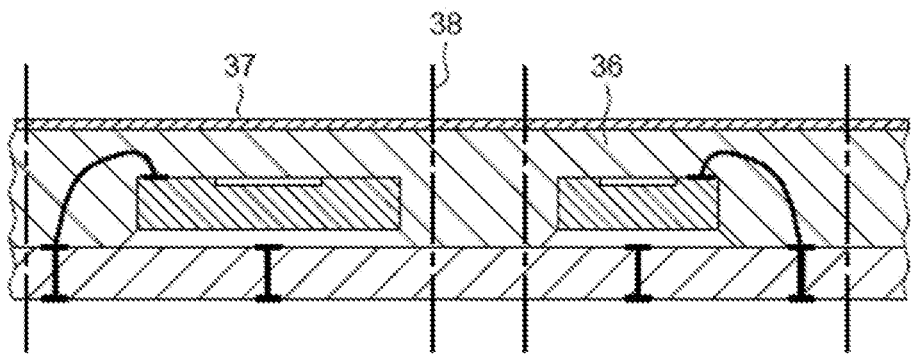

After demolding, optionally as illustrated in FIG. 5, a batch filtering layer 37, for example taking the form of a film, is produced above the front face of the batch encapsulating block 36.

Afterwards, a complete dicing operation 38, for example a sawing operation, is carried out along rows and columns, through the batch carrier substrate 29 and the batch encapsulating block 36, at distance from the chips 9 and 10, so as to obtain singulated or individual electronic components 1 and 2 such as described above.

According to one variant embodiment, chips 9 could be mounted on the one hand solely on one specific batch carrier substrate and, by performing the above operations, singulated electronic components 1 obtained, and on the other hand chips 10 could be mounted solely on one specific batch carrier substrate and, by performing the above operations, singulated electronic components 2 obtained.

Figure 6:
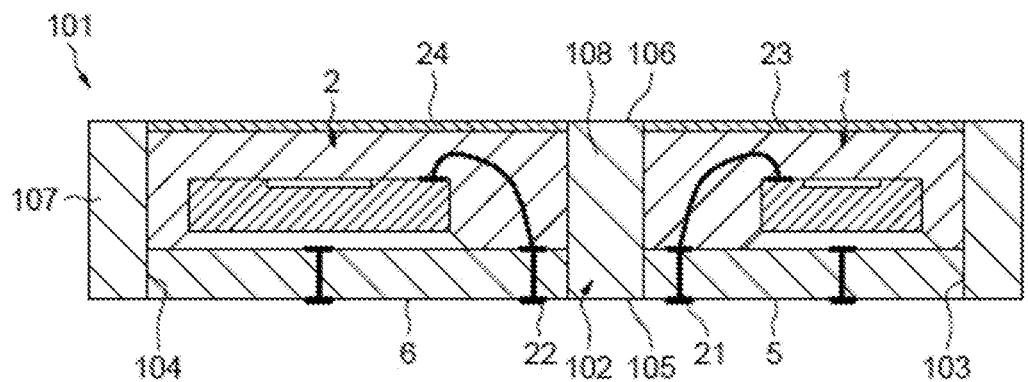
FIG. 6 shows a cross-section of an electronic device comprising the electronic components of FIG. 1.

As illustrated in FIG. 6, an electronic device 101 comprises an overmolded encapsulating and holding grid 102 that contains distant spaces 103 and 104 in which an electronic component 1 and an electronic component 2, such as described above, are located so that the back sides 5 and 6 of the electronic components 1 and 2 lie in the same back plane.

Since the electronic components 1 and 2 have the same thickness, the front sides 23 and 24 lie in the same front plane.

The encapsulating and holding grid 102 is configured so that the back sides 5 and 6 and the front sides 23 and 24 of the electronic components 1 and 2 are exposed.

The encapsulating and holding grid 102 has a back side 105 that lies in the same plane as the back sides 5 and 6 of the electronic components 1 and 2 and has a front side 106 that lies in the same plane as the front sides 23 and 24 of the electronic components 1 and 2.

The encapsulating and holding grid 102 envelops the periphery of the electronic components 1 and 2 and thus has a peripheral wall 107 and an intermediate partition 108 that extends between the electronic components 1 and 2.

The encapsulating and holding grid 102 is made of an opaque material. Thus, light cannot pass directly from one of the spaces 103 and 104 to the other. More particularly, the light emitted by the emitting electronic component 1 cannot directly reach the receiving electronic component 2.

The electronic device 101 may be fabricated in the following way.

Figure 7:
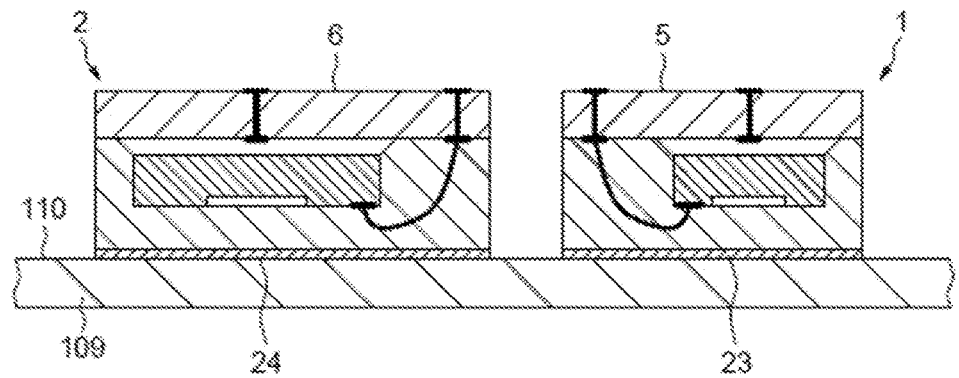
FIGS. 7-10 show steps of fabrication of the electronic device of FIG. 6.

As illustrated in FIG. 7, having provided a provisional batch carrier 109 taking the form of a sheet or of a film, electronic components 1 and 2 are mounted, at distance from each other, on one side 110 of this provisional carrier 109, by placing the front sides 23 and 24 of the electronic components 1 and 2 above the provisional carrier 109.

In a batch manufacturing fabricating process, pairs of electronic components 1 and 2 are respectively mounted in sites of the provisional batch carrier 109, by way of an adhesive holding film. These sites are advantageously adjacent and rectangular or square, and are arranged in rows and columns.

Figure 8:
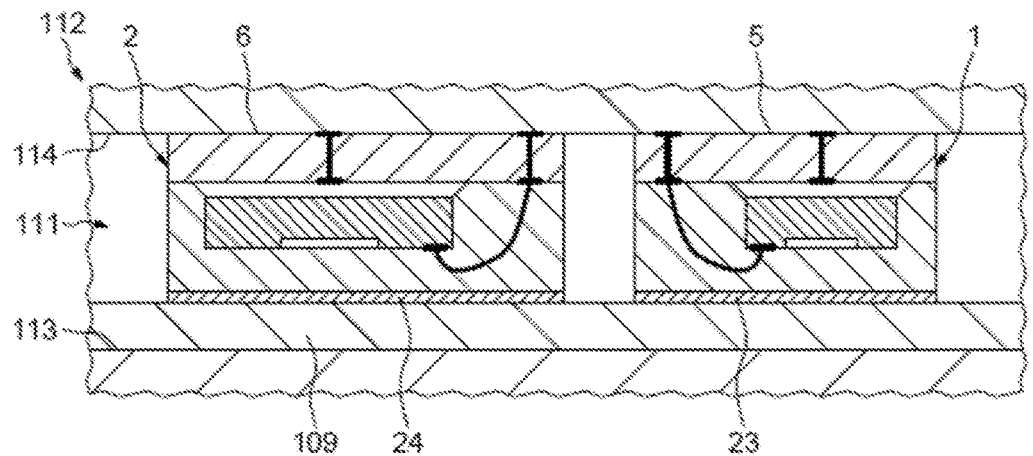

Next, as illustrated in FIG. 8, the electronic components 1 and 2, mounted on the provisional batch carrier 109, are placed in a cavity 111 of a mold 112, in a position such that the provisional batch carrier 109 bears against a face 113 of the cavity 111 and such that the back sides 5 and 6 of the electronic components 1 and 2 bear against a face 114 of the cavity 111 opposite and parallel to the face 113.

According to one variant embodiment, the provisional batch carrier 109 may also be used by way of wall of the cavity of the mold.

Figure 9:
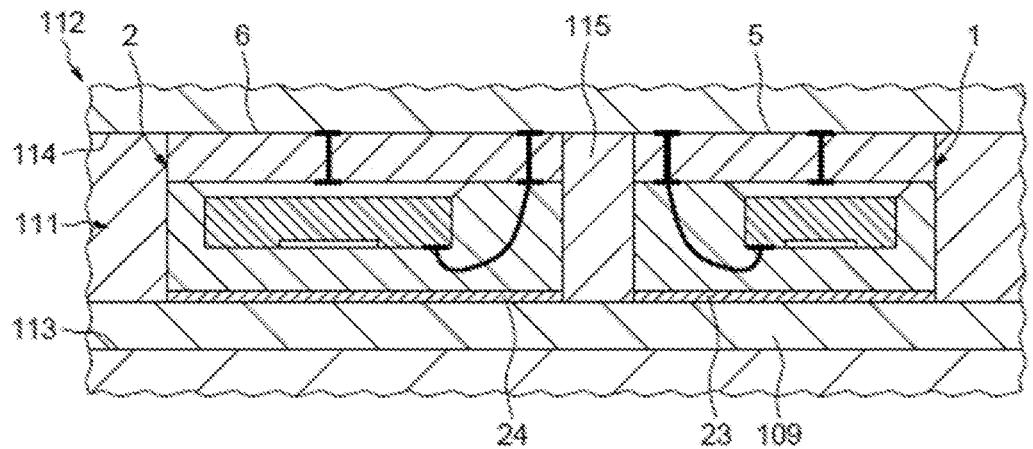

Next, as illustrated in FIG. 9, an opaque encapsulating material is injected into the space left free in the cavity 111 so as to produce, by overmolding, a batch grid 115 for encapsulating and holding the electronic components 1 and 2.

A cushioning film may be added in the cavity 111 against the face 114 in order to prevent mold flash and to facilitate demolding.

Figure 10:
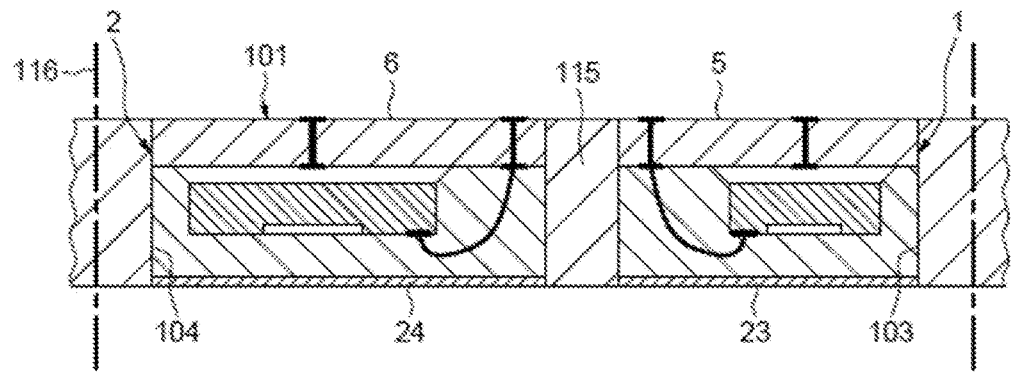

After demolding, as illustrated in FIG. 10, the provisional batch holder 109 is removed and a complete dicing operation 116 is carried out, for example by sawing, along the rows and columns separating the aforementioned sites, through the batch grid 115, and at distance from the distant spaces 103 and 104, so as to obtain one or more singulated electronic devices 101.

According to one variant embodiment (shown equivalently in FIG. 12), the electronic components 1 and 2 may be mounted upside down above the batch carrier substrate 109, the back sides 5 and 6 being on the side of the provisional batch carrier 109.

In this case, it is the front sides 23 and 24 that bear against a face of the cavity 111 of the mold 112.

Figure 11:
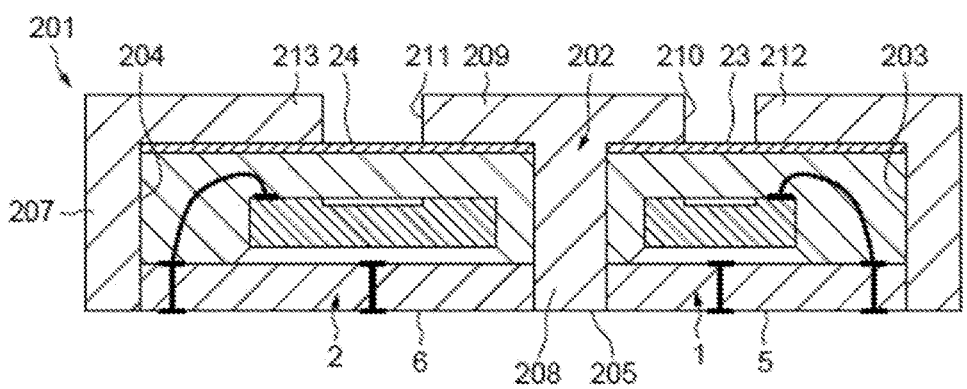
FIG. 11 shows a cross-section of another electronic device comprising the electronic components of FIG. 1.

FIG. 11 illustrates an electronic device 201 that comprises an overmolded encapsulating and holding grid 202 that delineates distant spaces 203 and 204 in which an electronic component 1 and an electronic component 2, such as described above, are located so that the back sides 5 and 6 of the electronic components 1 and 2 lie in the same back plane.

The encapsulating and holding grid 202 is configured so that the back sides 5 and 6 of the electronic components 1 and 2 are exposed and so that the front sides 23 and 24 of the electronic components 1 and 2 are partially exposed.

The encapsulating and holding grid 202 has a back side 205 that lies in the same plane as the back sides 5 and 6 of the electronic components 1 and 2.

The encapsulating and holding grid 202 differs from the encapsulating and holding grid 102 described above in that it is thicker than the electronic components 1 and 2 and in that it comprises, apart from a peripheral wall 207 and an intermediate partition 208 between the electronic components 1 and 2, a front wall 209 that extends above the front sides 23 and 24 of the electronic components 1 and 2.

The front wall 209 contains apertures 210 and 211 that are located in front of the optical elements 15 and 16 of the chips 9 and 10, so as to let light pass.

Thus, the encapsulating and holding grid 202 has, around the apertures 210 and 211, front rims above the electronic components 1 and 2.

The electronic device 201 may be fabricated in the following way.

Figure 12:
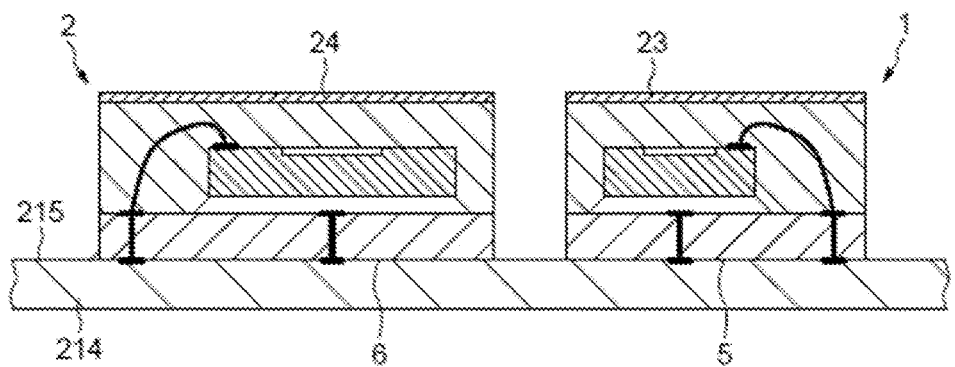
FIGS. 12-15 show steps of fabrication of the electronic device of FIG. 11.

As illustrated in FIG. 12, having provided a provisional batch carrier 109, taking the form of a sheet or a film, electronic components 1 and 2 are mounted, at distance from each other, on a side 215 of this provisional carrier 214, by placing the back sides 5 and 6 of the electronic components 1 and 2 above the provisional carrier 109.

In a batch fabricating process, pairs of electronic components 1 and 2 are respectively mounted in sites of the provisional batch carrier 213. These sites are advantageously adjacent and rectangular and are arranged in rows and columns.

Figure 13:
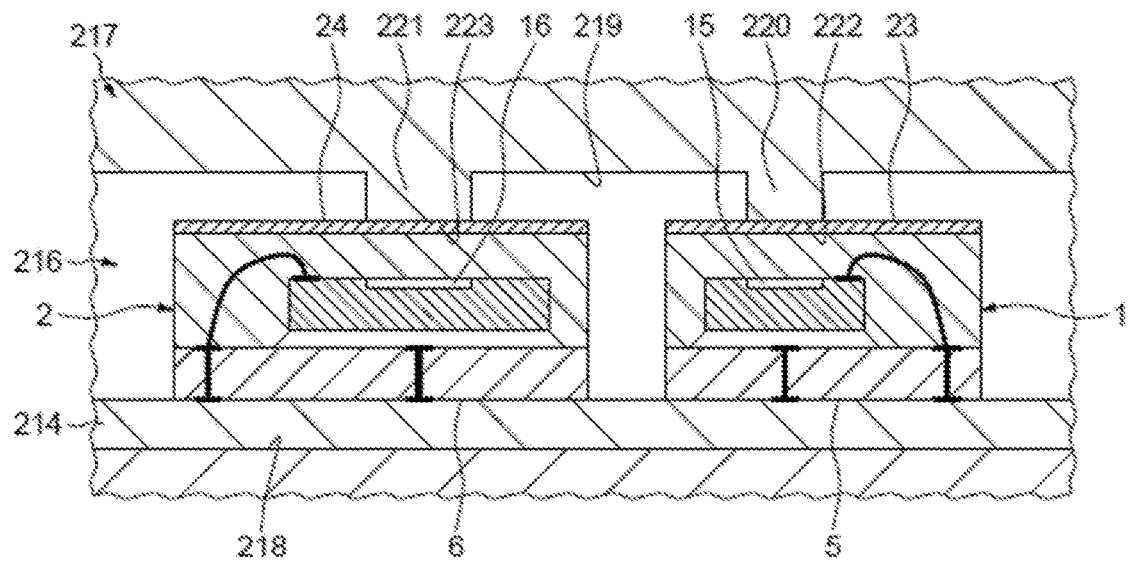

Next, as illustrated in FIG. 13, the electronic components 1 and 2, mounted on the provisional batch carrier 214, are placed in a cavity 216 of a mold 217, in a position such that the provisional batch carrier 214 is adjacent to a face 218 of the cavity 216 and such that the front sides 23 and 24 of the electronic components 1 and 2 are at distance from a face 219 of the cavity 216 opposite and parallel to the face 218.

The face 219 is provided with protruding embossments 220 and 221 that have faces 222 and 223 that bear against the front sides 23 and 24 of the electronic components 1 and 2.

Figure 14:
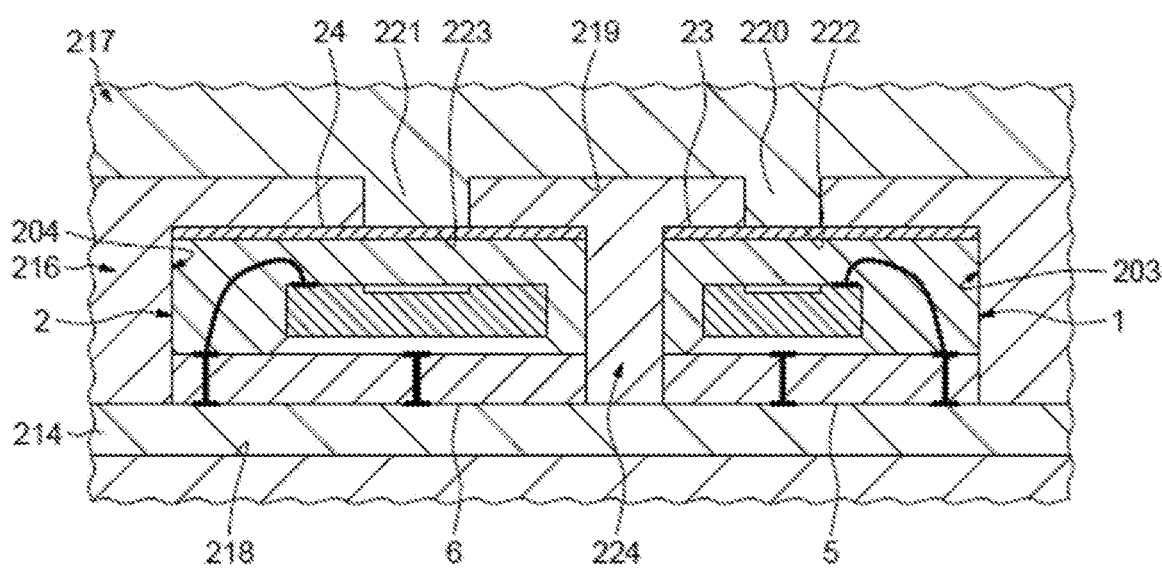

Next, as illustrated in FIG. 14, an opaque encapsulating material is injected into the space left free in the cavity 216 so as to produce, by overmolding, a batch grid 224 for encapsulating and holding the electronic components 1 and 2.

Figure 15:
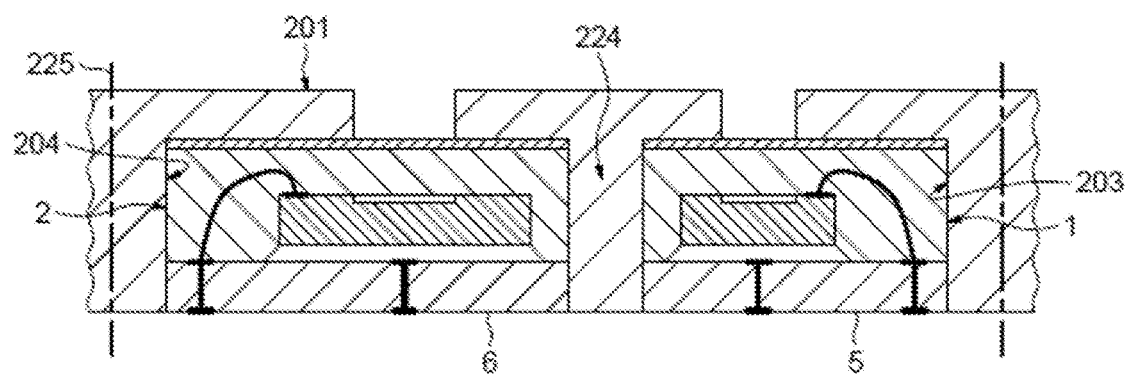

After demolding, as illustrated in FIG. 15, a complete dicing operation 225 is carried out, for example by sawing, along the rows and columns separating the aforementioned sites, through the branches of the batch grid 224, at distance from the distant spaces 203 and 204 in which the electronic components 1 and 2 are located.

This dicing operation may be carried out directly on the provisional batch carrier 214 or on another carrier after the provisional batch carrier 214 has been removed.

One or more singulated electronic devices 201 are then obtained, in the aforementioned locations.

According to one variant embodiment, in so far as one of the electronic components 1 and 2 is thicker than the other, the holding and encapsulating grid could have a front side located in the same plane as the front side of the thickest electronic component and, therefore, a front wall above the front side of the thinnest electronic component, this front wall containing an aperture.

Figure 16:
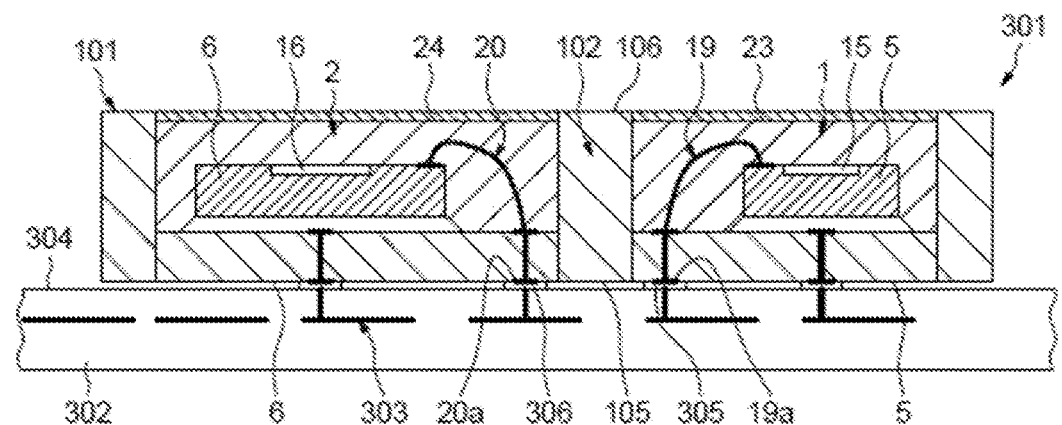
FIG. 16 shows a cross section of an electronic assembly comprising the electronic device of FIG. 6.

FIG. 16 illustrates an electronic assembly 301 that comprises a receiving substrate 302 that includes a network of electrical connections 303, for example an printed or integrated circuit board, and that comprises the electronic device 101 described above with reference to FIG. 6, said device being mounted on this receiving substrate 302.

The electronic device 101 is placed so that the back sides 5 and 6 of the electronic components 1 and 2 and the back side 105 of the holding and encapsulating grid 102 are located facing a front side 304 of the receiving substrate 302 and so that the back electrical contacts 19a and 20a of the electronic components 1 and 2 are connected to front bumps 305 and 306 of the electrical connection network 303.

The electronic assembly 301 comprises electronic components (not shown) able to exchange electrical signals with the electronic components 1 and 2 by way of the network of electrical connections 303.

In the electronic assembly 301, the electronic device 101 may be replaced by the electronic device 201.

The invention claimed is:

1. An electronic device, comprising:
a first electronic component comprising a first opaque carrier substrate having a first back side and a first front side, a first electronic chip having a back side mounted to the first front side of the first opaque carrier substrate, said first electronic chip including a first integrated optical element at a front side of the first electronic chip, a first overmolded transparent block encapsulating the first electronic chip above the first front side of the first opaque carrier substrate, and first electrical connections between the first electronic chip and first back electrical contacts at the first back side of the first opaque carrier substrate;
a second electronic component comprising a second opaque carrier substrate having a second back side and a second front side, a second electronic chip having a back side mounted to the second front side of the second opaque carrier substrate, said second electronic chip including a second integrated optical element at a front side of the second electronic chip, a second overmolded transparent block encapsulating the second electronic chip above the second front side of the second opaque carrier substrate, and second electrical connections between the second electronic chip and second back electrical contacts at the second back side of the second opaque carrier substrate; and
an opaque overmolded grid for encapsulating and holding both the first and second electronic components, wherein the opaque overmolded grid is configured so that respective back sides of the first and second electronic components are exposed and so that at least zones of respective front sides of the first and second electronic components located in front of the first and second integrated optical elements are exposed.

2. The device according to claim 1, wherein the opaque overmolded grid has a back side that is located in a same plane as the first and second back sides of the first and second opaque carrier substrates, respectively.

3. The device according to claim 1, wherein the opaque overmolded grid has a front side located in a same plane as the front side of at least one of the first and second electronic components.

4. The device according to claim 1, wherein the opaque overmolded grid has at least one rim above the front side of at least one of the first and second electronic components, wherein said at least one rim delineates an aperture extending through a front wall of the opaque overmolded grid to expose said zone.

5. The device according to claim 1, wherein the opaque overmolded grid comprises: a peripheral wall which surrounds the first and second electronic components and an intermediate partition extending between the first and second electronic components.

6. The device according to claim 1, wherein the first and second encapsulating blocks are provided with a filtering material that filters light.

7. The device according to claim 6, wherein the filtering material comprises a filter layer extending above each of the first and second encapsulating blocks.

8. The device according to claim 6, wherein the filtering material comprises particles included in an encapsulating material which forms the first and second encapsulating blocks.

9. The device according to claim 1, wherein the first integrated optical element is a light emitter and the second integrated optical element is a light receiver.

10. An electronic assembly, comprising:
a receiving substrate including a network of electrical connections; and
an electronic device, comprising:
a first electronic component comprising a first opaque carrier substrate having a first back side and a first front side, a first electronic chip having a back side mounted to the first front side of the first opaque carrier substrate, said first electronic chip including a first integrated optical element at a front side of the first electronic chip, a first overmolded transparent block encapsulating the first electronic chip above the first front side of the first opaque carrier substrate, and first electrical connections between the first electronic chip and first back electrical contacts at the first back side of the first opaque carrier substrate;
a second electronic component comprising a second opaque carrier substrate having a second back side and a second front side, a second electronic chip having a back side mounted to the second front side of the second opaque carrier substrate, said second electronic chip including a second integrated optical element at a front side of the second electronic chip, a second overmolded transparent block encapsulating the second electronic chip above the second front side of the second 0paque carrier substrate, and second electrical connections between the second electronic chip and second back electrical contacts at the second back side of the second opaque carrier substrate; and
an opaque overmolded grid for encapsulating and holding both the first and second electronic components, wherein the opaque overmolded grid is configured so that respective back sides of the first and second electronic components are exposed and so that at least zones of respective front sides of the first and second electronic components located in front of the first and second integrated optical elements are exposed;
wherein said electronic device is mounted to the receiving substrate in a position such that the respective back sides of the first and second electronic components are adjacent to the receiving substrate; and
wherein the first and second back electrical contacts are connected to the electrical contacts of the network of electrical connections of the receiving substrate.

11. The assembly according to claim 10, wherein the opaque overmolded grid has a back side that is located in a same plane as the respective back sides of the first and second electronic components.

12. The assembly according to claim 10, wherein the opaque overmolded grid has a front side located in a same plane as the front side of at least one of the first and second electronic components.

13. The assembly according to claim 10, wherein the opaque overmolded grid has at least one rim above the front side of at least one of the first and second electronic components, wherein said at least one rim delineates an aperture extending through a front wall of the opaque overmolded grid to expose said zone.

14. The assembly according to claim 10, wherein the opaque overmolded grid comprises: a peripheral wall which surrounds the first and second electronic components and an intermediate partition extending between the first and second electronic components.

15. The assembly according to claim 10, wherein the first and second encapsulating blocks are provided with a filtering material that filters light.

16. The assembly according to claim 15, wherein the filtering material comprises a filter layer extending above each of the first and second encapsulating blocks.

17. The assembly according to claim 15, wherein the filtering material comprises particles included in an encapsulating material which forms the first and second encapsulating blocks.

18. The assembly according to claim 10, wherein the first integrated optical element is a light emitter and the second integrated optical element is a light receiver.

* * * * *